United States Patent [19]
Uomi et al.

[11] Patent Number: 5,363,393
[45] Date of Patent: Nov. 8, 1994

[54] SURFACE EMITTING SEMICONDUCTOR LASER

[75] Inventors: Kazuhisa Uomi, Hachioji; Misuzu Sagawa; Atsushi Takai, both of Kokubunji, all of Japan

[73] Assignee: Hitachi, Ltd., Tokyo, Japan

[21] Appl. No.: 38,402

[22] Filed: Mar. 29, 1993

[30] Foreign Application Priority Data

Mar. 31, 1992 [JP] Japan .................................. 4-076602

[51] Int. Cl.$^5$ .............................................. H01S 3/19
[52] U.S. Cl. ........................................ 372/45; 372/96; 372/99; 372/46
[58] Field of Search ................... 372/45, 96, 99, 46

[56] References Cited

U.S. PATENT DOCUMENTS

| | | | |
|---|---|---|---|
| 4,943,970 | 7/1990 | Bradley | 372/45 |
| 4,949,350 | 8/1990 | Jewell et al. | 372/45 |
| 5,018,157 | 5/1991 | Deppe et al. | 372/45 |
| 5,038,356 | 8/1991 | Botez et al. | 372/45 |
| 5,170,407 | 12/1992 | Schubert et al. | 372/96 |
| 5,208,820 | 5/1993 | Kurihara et al. | 372/45 |
| 5,216,685 | 6/1993 | Asada | 372/45 |

OTHER PUBLICATIONS

IEEE Journal of Quantum Electronics, vol. 27, No. 6, pp. 1332-1346, Jun. 1991, Jewell et al. "Vertical-Cavity Surface-Emitting Lasers: Design, Growth, Fabrication, Characterization".

*Primary Examiner*—Georgia Y. Epps
*Attorney, Agent, or Firm*—Kenyon & Kenyon

[57] ABSTRACT

A surface emitting semiconductor laser of a laminated structure having at least a light emitting active layer sandwiched between a dielectric film multi-layer mirror and a p-type semiconductor multi-layer mirror on a semiconductor substrate. The energy $\Delta Ec$ of conduction band discontinuity is higher than the energy $\Delta Ev$ of valence band discontinuity between at least two kinds of semiconductor layers with different refractive indices constituting the p-type semiconductor multi-layer mirror. On the other hand, the energy $\Delta Ev$ of valence band discontinuity is higher than the energy $\Delta Ec$ of conduction band discontinuity between at least two kinds of semiconductor layers with different refractive indices constituting the n-type semiconductor multi-layer mirror.

11 Claims, 4 Drawing Sheets

SURFACE EMITTING SEMICONDUCTOR LASER

BACKGROUND OF THE INVENTION

The present invention relates to a surface emitting semiconductor laser.

Conventional surface emitting semiconductor lasers are disclosed in detail and systematically in the article by Jack L. Jewell et al in IEEE Journal of Quantum Electronics, vol. 27, No. 6, pp. 1332–1346 (1991).

The conventional surface emitting semiconductor lasers have the following problems to be solved.

Figure 1A:
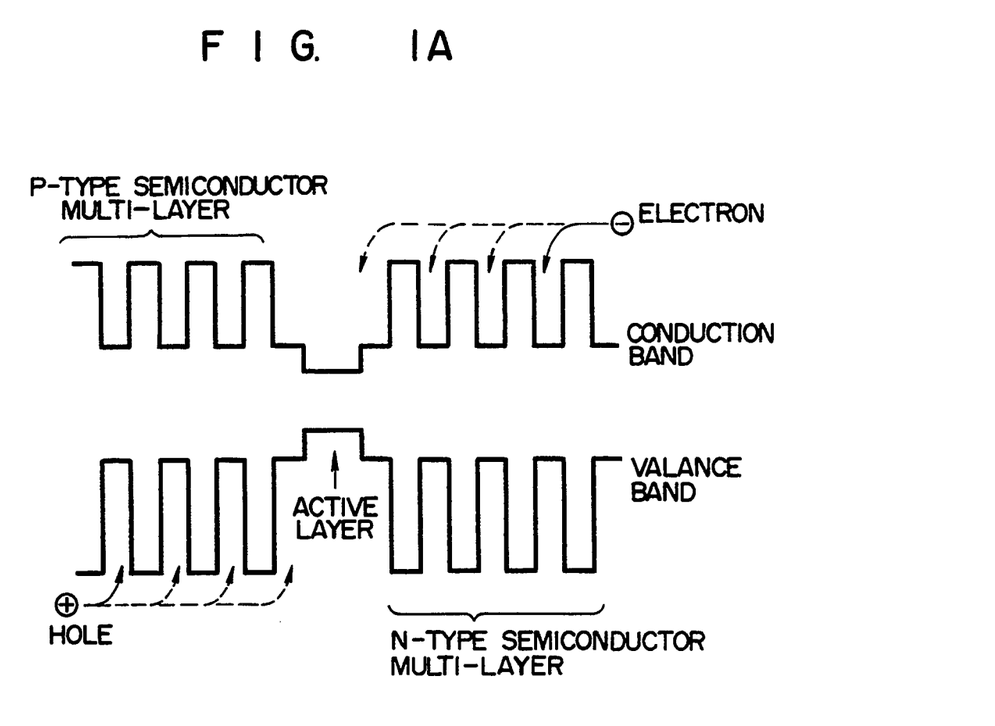
FIGS. 1A and 1B are theory views for explaining the operation of the present invention.

First, as described in pages 1343–1344 of the above article, a surface emitting semiconductor laser has a large device resistance of several hundreds to several thousands $\Omega$ compared with several $\Omega$ in a general semiconductor laser. Particularly, its structure in which an active region is reduced to about 10 $\mu m$ in diameter to define a low threshold current has a very large device resistance. As a result, it is difficult to achieve the CW (continuous wave) operation of the laser due to heat generation, and further the large CR time constant (C: device capacitance, R: device resistance) and the large device resistance which is larger than 50 $\Omega$ in the driving circuit also hindered the high speed operation. The large device resistance is ascribed to the fact that the hereto barrier between the semiconductor layers constituting a semiconductor multi-layer mirror is high and its number of periods is as large as 10–30 periods so that a sufficient amount of carriers cannot be injected into the active layer through the multi-layer mirror (FIG. 1A). Particularly, the holes having an effective mass cannot climb over this high hetero barrier, thus causing a great increase in the device resistance in a p-type semiconductor multi-layer mirror region. In order to obviate such a disadvantage, pages 1343–1344 and FIG. 15 in page 1344 make a proposal in which a region with a gradually changing composition or a superlattice layer is inserted between two kinds of semiconductor layers constituting the semiconductor multi-layer mirror. The proposal permits the device resistance to be reduced to about 1000 $\Omega$, but the high hetero barrier still remains. This proposal cannot provide a decisive solution.

Another problem to be solved is that in the surface emitting semiconductor laser in a 0.98 $\mu m$ band having a InGaAs quantum well active layer, its semiconductor multi-layer mirror, which is made of AlAs and GaAs, contains Al atoms so that the reliability of the device is deteriorated.

SUMMARY OF THE INVENTION

A first embodiment of the present invention provides a surface emitting semiconductor laser having a small device resistance.

A second embodiment of the present invention also provides a surface emitting semiconductor laser in a 0.98 $\mu m$ band having high reliability.

Figure 1B:
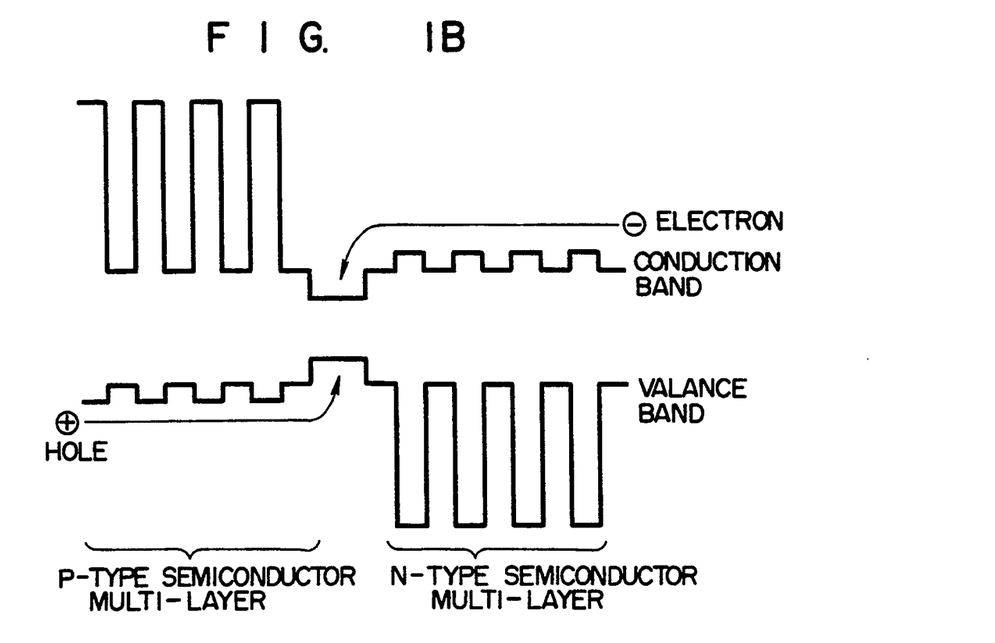

The first embodiment of the present invention can be attained by making p-type and n-type semiconductor multi-layer mirrors of a surface emitting semiconductor laser of different material systems. Particularly, as shown in FIG. 1B the p-type semiconductor multi-layer mirror is made of a material system in which the energy $\Delta Ec$ of conduction band discontinuity is higher than the energy $\Delta Ev$ of valence band discontinuity while the n-type semiconductor multi-layer mirror is made of a material system in which $\Delta Ev$ is higher than $\Delta Ec$. This embodiment can also be attained by the surface emitting semiconductor laser having a p-type semiconductor multi-layer mirror made of at least two kinds of III–V compound semiconductor layers with only group III atoms replaced and with different refractive index, and an n-type semiconductor multi-layer mirror made of at least two kinds of III–V compound semiconductor layers with only group V atoms replaced and with different refractive index. Further, in addition to the above means, the surface emitting semiconductor laser in which p-type doping concentration of the semiconductor layer having the largest energy gap is higher than that of other semiconductor layers in p-type multi-layer, and n-type doping concentration of the semiconductor layer having the largest energy gap is higher than that of other semiconductor layers in n-type multi-layer. The above means is particularly efficient in the surface emitting semiconductor laser with a substrate of InP which oscillates in long wavelength bands (1.3 $\mu m$ band or 1.55 $\mu m$ band).

The second embodiment of the present invention can be attained by the surface emitting semiconductor laser in a 0.98 $\mu m$ band having an InGaAs quantum well active layer in which its semiconductor multi-layer mirror is made of two kinds of semiconductor layers with no Al and different refractive index, particularly a combination of InGaP and GaAs, or InGaAsP and GaAs.

Referring to FIG. 1B, the first operation of the present invention will be explained below. First, if the p-type semiconductor multi-layer mirror is made of a material system ($\Delta Ec > \Delta Ev$) in which the energy $\Delta EC$ of conduction band discontinuity is higher than the energy $\Delta Ev$ of valence band discontinuity, the energy $\Delta Ev$ of valence band discontinuity becomes small. As a result, as shown in FIG. 1B, the height of the hereto barrier for holes is reduced so that the carriers can be smoothly injected into an active layer through the p-type multi-layer mirror and the resistance of the p-type multi-layer mirror regions can be greatly reduced. Further, the high hetero barrier existing in the conduction band assures a sufficient difference in the refractive index so that the reflectivity in the p-type semiconductor multi-mirror can be set for a large value using the periodical structure of the semiconductor layers having a thickness of $\lambda/4n$ ($\lambda$: laser wavelength, n: refractive index in each layer). Thus, the p-type semiconductor multi-layer can be operated as a resonator for laser oscillation. The condition of $\Delta Ec > \Delta Ev$ can be assured by the combination of InGaAsP and InAlAs ($\Delta Ev^* = 0$–0.15), InGaAsP and InGaAlAs ($\Delta Ev^* = 0.0$–0.15), InGaAsP and InAlAsP ($\Delta Ev^* = 0.2$–0.35), InAlAs and InGaAlAs ($\Delta Ev^* = 0.2$–0.35) or InGaAlAs and InGaAlAs having different Al compositions ($\Delta Ev^* = 0.2$–0.35). Here, the $\Delta Ev^*$ represents the ratio of valence band discontinuity defined by $\Delta Ev^* = \Delta Ev/(\Delta Ec + \Delta Ev)$. In particular, in the combinations of InGaAsP and InAlAs, and InGaAsP and InGaAlAs, $\Delta Ev$ can be brought close to nearly zero. There is almost no hetero barrier for the holes so that the resistance of the p-type semiconductor multi-layer mirror can be substantially determined by that of the material and can therefore be greatly reduced. Further, a system of III–V compound semiconductor materials with only group III atoms replaced satisfies the condition of $\Delta Ec > \Delta Ev$ so that the p-type semiconductor multi-layer mirror made of such a material system contributes to resistance reduction as described above. Examples of such a material system are the combinations of InAlAs and InGaAlAs, and InGaAlAs and InGaAlAs having different Al compositions. Additionally, even if the n-type multi-layer mirror comprises dielectric multi-layer mirror, the resistance of the p-type semiconductor multi-layer mirror can be reduced in the described manner.

On the other hand, if the n-type semiconductor multi-layer mirror is made of a material system of $\Delta Ev > \Delta Ec$, as shown in FIG. 1B, the height of the hetero barrier for electrons is reduced so that the electrons can be smoothly injected into an active layer through the n-type multi-layer mirror and the resistance of the n-type multi-layer mirror regions can be greatly reduced. The condition of $\Delta Ev > \Delta Ec$ can be assured by the combination of InP and InGaAsP ($\Delta Ec^* = 0.20$–$0.40$) or InGaAsP and InGaAsP having different compositions ($\Delta Ec^* = 0.20$–$0.35$). Now, the $\Delta Ec^*$ represents the ratio of conduction band discontinuity defined by $\Delta Ec^* = \Delta Ec/(\Delta Ec + \Delta Ev)$. Further, a material system of III–V compound semiconductor materials with only group V atoms replaced satisfies the condition of $\Delta Ev > \Delta Ec$ so that the n-type semiconductor multi-layer mirror made of such a material system contributes to resistance reduction as described above.

Further, in addition to the above means, the operation of the present invention can be promoted by the "modulation doped structure" of a surface emitting semiconductor laser in which p-type doping concentration of the semiconductor layer having the largest energy gap is higher than that of other semiconductor layers in p-type multi-layer, and n-type doping concentration of the semiconductor layer having the largest energy gap is higher than that of other semiconductor layers in n-type multi-layer. Namely, this assists in the reduction in the height of the hetero barrier in each semiconductor multi-layer mirror so that the resistance thereof can be further reduced.

The second operation of the present invention will be explained below. It is well known that the semiconductor laser of a GaAlAs system in which the region through which laser light propagates includes Al atoms has a much more inferior device reliability than that of the semiconductor laser of an InGaAsP system. It can be supposed that this mainly results from an oxidation of Al atoms which are component atoms. In order to remove such a phenomenon, in accordance with the present invention, the semiconductor multi-layer mirror is made of two kinds of semiconductor layers with no Al and different refractive indices, particularly a combination of InGaP and GaAs, or InGaAsP and GaAs. Thus, the surface emitting semiconductor laser in a 0.98 µm band having an InGaAs quantum well active layer can be provided which is free from the defect of Al oxidation and has high reliability. In this case, although the difference in the refractive index between InGaP and GaAs which is 0.3 is smaller than 0.6 between GaAs and AlAs, increasing the number of periods of semiconductor layers can provide a high reflectivity. Thus, the resultant semiconductor multi-layer mirror can operate as a resonator for laser oscillation.

DESCRIPTION OF THE PREFERRED EMBODIMENTS

Embodiment 1

Figure 2:
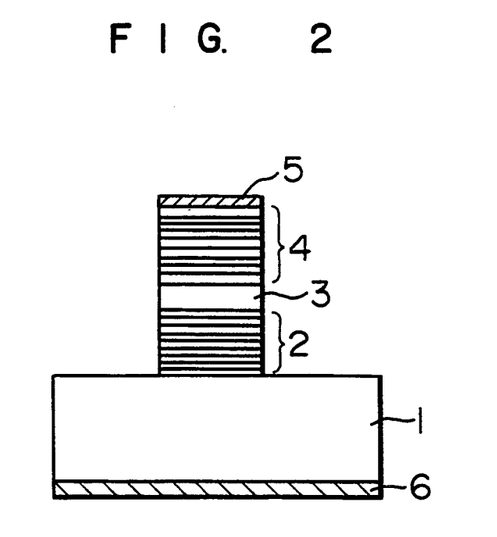
FIGS. 2 to 7 are sectional views showing the semiconductor lasers according to embodiments of the present invention, respectively.

FIG. 2 shows an application of the present invention to a 1.3 µm surface emitting semiconductor laser. On a p-type InP substrate 1 a p-type semiconductor multi-layer mirror 2 was formed which has a periodic structure of 25 periods composed of p-type InGaAsP (band gap wavelength: 1.2 µm) films and p-type InAlAs films which are alternately stacked and have a thickness $\frac{1}{4}$ times as large as the lasing wavelength in the corresponding medium. An InGaAsP active layer 3 was formed on the mirror 2. On the active layer 3 an n-type semiconductor multi-layer mirror 5 was formed which has a periodic structure of 20 periods composed of n-type InGaAsP (band gap wavelength: 1.25 µm) films and n-type InP films which are alternately stacked and have a thickness $\frac{1}{4}$ times as large as the lasing wavelength in the corresponding medium. The mirror 2, active layer 3 and mirror 4 were successively deposited on the substrate 1 by metal organic chemical vapor deposition. An electrode 5 for the n-type semiconductor was formed to have an area having a diameter of 10 µm. Reactive ion etching was performed using the electrode 5 as a mask to form a protruding light-emitting region which reaches the p-type InP substrate 1. Finally, an electrode 6 for the p-type semiconductor was formed. The thickness of an Au film constituting the n-type semiconductor was set for 50 nm which holds the transmission of light of several %s and permits light to taken from above. The fabricated device experimentally oscillated at the threshold current of 5 mA in a CW operation at room temperature. Since both p- and n-type semiconductor multi-layer mirrors have a low resistance structure, the device resistance could be reduced to about 20 Ω which is 1/20 as large as the conventional surface emitting semiconductor laser. As a result, the modulation bandwidth limited by a CR time constant could exceed 50 GHz.

Embodiment 2

Figure 3:
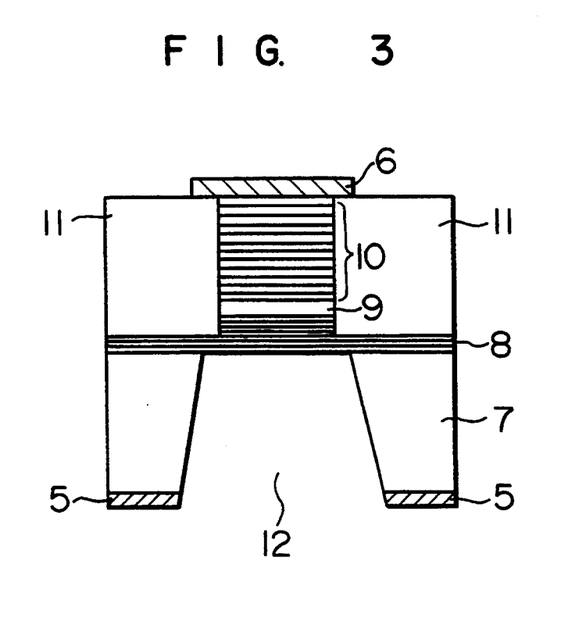

FIG. 3 shows an application of the present invention to a 1.55 µm surface emitting semiconductor laser having a quantum well structure. On an n-type InP substrate 7 an n-type semiconductor multi-layer mirror 8 was formed which has a periodic structure of 30 periods composed of n-type InGaAsP (band gap wavelength: 1.0 µm) films and n-type InGaAsP films (band gap wavelength: 1.45 µm) which are alternately stacked and have a thickness $\frac{1}{4}$ times as large as the lasing wavelength in the corresponding medium. On the mirror 8 a multiple quantum well active layer is formed which has a periodic structure of 5–20 periods composed of InGaAs quantum well layers each having a thickness of 7 nm and InGaAsP barrier layers each having a thickness of 10 nm. On the active layer 9 a p-type semiconductor multi-layer mirror 10 was formed which has a periodic structure of 25 periods composed of p-type InGaAlAs (band gap wavelength: 1.40 µm) films and p-type InAlAs films which are alter-nately stacked and have a thickness $\frac{1}{4}$ times as large as the lasing wavelength in the corresponding medium. The mirror 8, active layer 9 and mirror 10 were successively deposited on the substrate 7 by metal organic chemical vapor deposition. Reactive ion etching was performed to etch the n-type semiconductor multi-layer mirror 8 to its middle, thereby providing a protruding light-emitting region (5 μm=5 μm). An Fe doped InP layer 11 is embedded to grow in the etched area. The n-type InP substrate 7 is selectively etched away to a window region 12. Finally, electrodes 5 and 6 for the n- and p-type semiconductors were formed, respectively. The device fabricated experimentally oscillated at the threshold current of 2 mA in a CW operation at room temperature. Since both p- and n-type semiconductor multi-layer mirrors have a low resistance structure, the device resistance could be reduced to about 30 Ω which is 1/20 as large as the conventional surface emitting semiconductor laser. As a result, the modulation bandwidth limited by a CR time constant could exceed 50 GHz. Further, an increase in the relaxation oscillation frequency of the device which is attributable to the quantum size effect by the quantum well active layer permitted a very high speed operation of 40 Gbit/s to be carried out.

Embodiment 3

Figure 4:
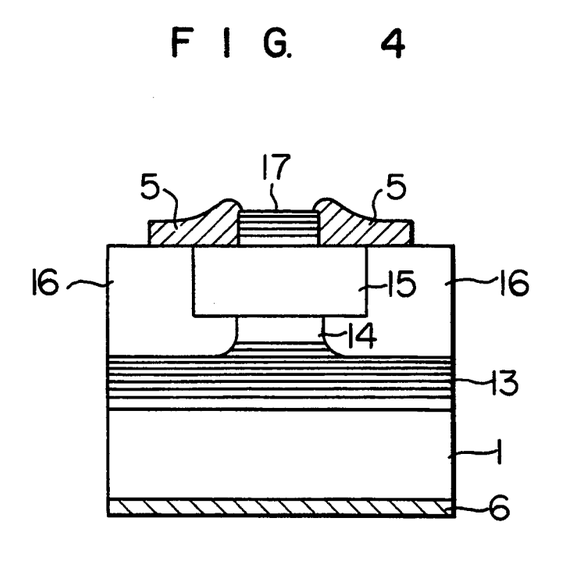

FIG. 4 shows an application of the present invention to a 1.55 μm surface emitting semiconductor laser having a strained quantum well type active layer. On a p-type InP substrate 1 a p-type semiconductor multi-layer mirror 13 was formed which has a periodic structure of 30 periods composed of p-type InGaAsP (band gap wavelength: 1.45 μm) films and p-type InGaAlAs films (band gap wavelength: 0.86 μm) which are alternately stacked and have a thickness ¼ times as large as the lasing wavelength in the corresponding medium. On the mirror 13 a strained quantum well type active layer 14 was formed which has a periodic structure of 5–30 periods composed of InGaAs strained quantum well layers each having a thickness of 4 nm and a strain of Δa/a of +0.9% and InGaAsP barrier layers each having a thickness of 10 nm. On the active layer 14 an n-type InP layer 15 was formed. The mirror 13, active layer 14 and mirror 15 were successively deposited on the substrate 1 by metal organic chemical vapor deposition. By etching reaching the strained quantum well type active layer 14 and undercut etching, the strained quantum well active layer 14 is defined to an area having a diameter of 8 μm. A polyimide film 16 which is an organic insulator is embedded in the etched area so as to provide a planar structure. On the n-type InP layer 15, a dielectric multi-layer mirror 17 was formed which has a periodic structure of 5 periods composed of $TiO_2$ films and $SiO_2$ films which are alternately stacked and have a thickness ¼ times as large as the lasing wavelength in the corresponding medium. Finally, ring-shaped electrodes 5 and 6 for the p- and n-type semiconductors were formed. The device fabricated experimentally showed the feature of the strained quantum well type active layer that it oscillated at the very low threshold current of 1 mA in a CW operation at room temperature. Since the p-type semiconductor multi-layer mirrors have a low resistance structure, the device resistance could be reduced to about 25 Ω which is 1/20 as large as the conventional surface emitting semiconductor laser. Further, the effect of reducing a CR time constant and an increase in the relaxation oscillation frequency of the device which is attributable to the quantum size effect by the strained quantum well active layer permitted a very high speed operation of 50 Gbit/s to be carried out.

Embodiment 4

Figure 5:
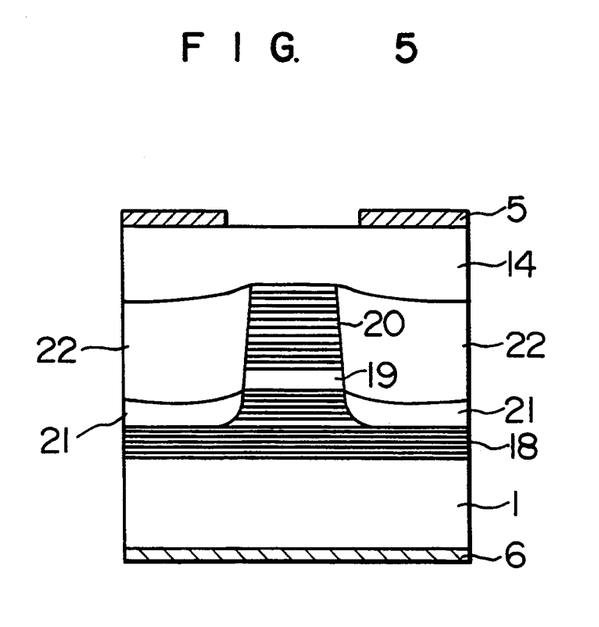

FIG. 5 shows an application of the present invention to a 1.55 μm band surface emitting semiconductor laser. On a p-type InP substrate 1 a p-type semiconductor multi-layer mirror 18 was formed which has a periodic structure of 30 periods composed of p-type InGaAlAs (p-doping concentration: $2\times10^{18}$ cm$^{-3}$, band gap wavelength: 1.40 μm ) films and p-type InGaAlAs films ( p-doping concentration: $4\times10^{18}$ cm$^{-3}$, band gap wavelength: 0.89 μm which are alternately stacked and have a thickness ¼ times as large as the lasing wavelength in the corresponding medium. A 1.55 μm band InGaAsP active layer 19 was formed on the mirror 18. On the active layer 19 an n-type semiconductor multi-layer mirror 20 was formed which has a periodic structure of 25 periods composed of n-type InGaAsP (doping concentration: $1\times10^{18}$ cm$^{-3}$, band gap wavelength: 1.45 μm) films and n-type InP films (doping concentration: $3\times10^{18}$ cm$^{-3}$) which are alternately stacked and have a thickness ¼ times as large as the lasing wavelength in the corresponding medium. The mirror 18, active layer 19 and mirror 20 were successively deposited on the substrate 1 by metal organic chemical vapor deposition. Etching is made to remain an area of 7 μm×7 μm. An n-type embedded layer 21 and an n-type embedded layer 22 were formed. An n-type InP layer 14 is formed to provide a planar structure. An electrode 5 having an opening window for the n-type semiconductor and an electrode 6 for the p-type semiconductor were formed. The device fabricated experimentally, which has a modulation doped structure in both p- and n-type semiconductor multi-layer mirrors, greatly enjoys the effect of resistance reduction. Namely, the device resistance could be reduced to 8 Ω which is substantially equal to that of the conventional edge emitting semiconductor laser.

Embodiment 5

Figure 6:
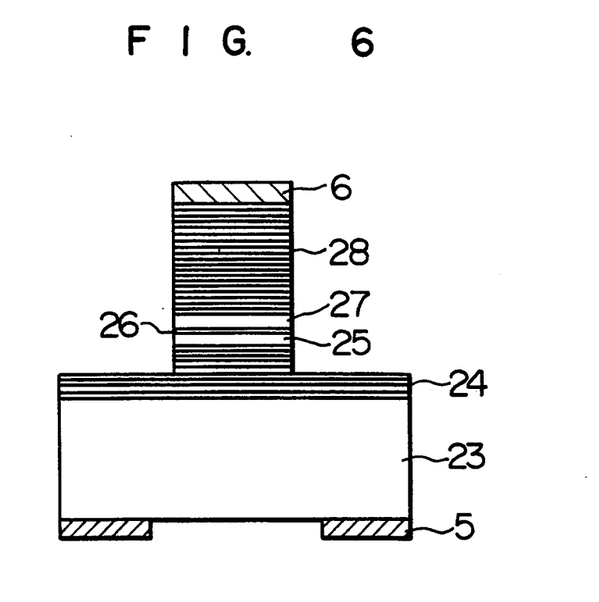

FIG. 6 shows an application of the present invention to a 0.98 μm band surface emitting semiconductor laser. On a n-type GaAs substrate 23 an n-type semiconductor multi-layer mirror 24 was formed which has a periodic structure of 25 periods composed of n-type InGaP films and n-type GaAs films which are alternately stacked and have a thickness ¼ times as large as the lasing wavelength in the corresponding medium. On the mirror 24, an n-type InGaAs spacer layer 25, an InGaAs strained well type active layer 26 and a p-type InGaAs Spacer layer were successively formed on the mirror 23. On the spacer layer 27 an p-type semiconductor multi-layer mirror 28 was formed which have a periodic structure of 30 periods composed of p-type InGaP films and p-type GaAs films which are alternately stacked and have a thickness ¼ times as large as the lasing wavelength in the corresponding medium. The mirror 24, spacer layer 25, active layer 26, spacer layer 27 and mirror 28 were successively deposited on the substrate 23 by metal organic chemical vapor deposition. An electrode 6 for the p-type semiconductor was formed to have an area having a diameter of 3–10 μm. Reactive ion etching was performed using the electrode 6 as a mask to form a protruding light-emitting region. Finally, an electrode 5 having a window region was formed for the p-type semiconductor. The device fabricated experimentally oscillated at the threshold current of 0.5 mA in a CW operation at room temperature. Since the region through which laser light propagates does not contain Al atoms, the resultant device has very high reliability. Namely, no deterioration was observed after a life test with 5000 hours under a 60° C. 2 mW constant optical output operation.

Embodiment 6

Figure 7:
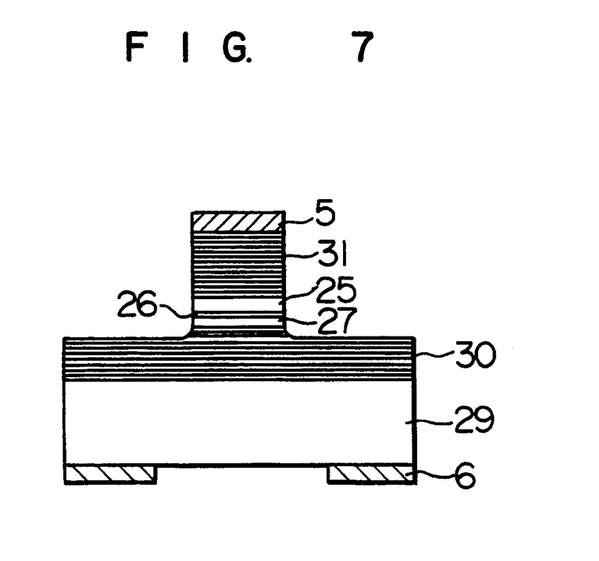

FIG. 7 shows an application of the present invention to a 0.98 μm band surface emitting semiconductor laser. On a p-type GaAs substrate 29 a p-type semiconductor multi-layer mirror 30 was formed which has a periodic structure of 30 periods composed of p-type InGaAsP (band gap wavelength: 0.75 μm) films and p-type GaAs films which are alternately stacked and have a thickness ¼ times as large as the lasing wavelength in the corresponding medium. On the mirror 30, an p-type InGaAs spacer layer 27, an InGaAs strained well type active layer 26 and an n-type InGaAs spacer layer 25 were successively formed. On the spacer layer 25 an n-type semiconductor multi-layer mirror 31 was formed which has a periodic structure of 35 periods composed of n-type InGaAsP films (band gap wavelength: 0.75 μm) and n-type GaAs films which are alternately stacked and have a thickness ¼ times as large as the lasing wavelength in the corresponding medium. The mirror 30, spacer layer 27, active layer 26, spacer layer 25 and mirror 28 were successively deposited on the substrate 29 by metal organic chemical vapor deposition. An electrode 5 for the n-type semiconductor was formed to have an area having a diameter of 3-10 μm. Reactive ion etching was performed using the electrode 5 as a mask to form a protruding light-emitting region. Finally, an electrode 6 having a window region was formed for the p-type semiconductor. The device fabricated experimentally oscillated at the threshold current of 0.5 mA in a CW operation at room temperature. Since the region through which laser light propagates does not contain Al atoms, the resultant device has very high reliability. Namely, no deterioration was observed after elapse of 10,000 hours in a life test under a 60° C. 2 mW constant optical output operation.

In accordance with the present invention, the height of the hetero barrier for electrons and holes is reduced so that a surface emitting semiconductor laser having a low device resistance can be provided. In accordance with the present invention, a 0.98 μm surface emitting semiconductor laser having a semiconductor multi-layer mirror including no Al atoms can also be provided. As a result, the present invention is efficient for CW oscillation at room temperature and high speed modulating operation of a long wavelength band surface emitting semiconductor laser. Further, the present invention is efficient to improve the reliability of the 0.98 μm band surface emitting semiconductor laser.

We claim:

1. A surface emitting semiconductor laser of a laminated structure having at least a light emitting active layer sandwiched between a p-type semiconductor multi-layer mirror and an n-type semiconductor multi-layer mirror on a semiconductor substrate and a pair of electrodes for injecting current into the active layer, wherein said p- and n-semiconductor multi-layer mirrors are made of different semiconductor materials.

2. A surface emitting semiconductor layer of a laminated structure having at least a light emitting active layer sandwiched between a p-type semiconductor multi-layer mirror and an n-type semiconductor multi-layer mirror on a semiconductor substrate and a pair of electrodes for injecting current into the active layer, wherein energy $\Delta Ec$ of conduction band discontinuity is higher than energy $\Delta Ev$ of valence band discontinuity between at least two kinds of semiconductor layers with different refractive indices constituting said p-type semiconductor multi-layer mirror while the energy $\Delta Ev$ of valence band discontinuity is higher than the energy $\Delta Ec$ of conduction band discontinuity between at least two kinds of semiconductor layers with different refractive indices constituting said n-type semiconductor multi-layer mirror the n-type semiconductor multi-layer.

3. A surface emitting semiconductor laser of a laminated structure having at least a light emitting active layer sandwiched between a dielectric film multi-layer mirror and a p-type semiconductor multi-layer mirror on a semiconductor substrate and a pair of electrodes for injecting current into the active layer, wherein energy $\Delta Ec$ of conduction band discontinuity is higher than energy $\Delta Ev$ of valence band discontinuity between at least two kinds of semiconductor layers with different refractive indices constituting said p-type semiconductor multi-layer mirror.

4. A surface emitting semiconductor laser of a laminated structure having at least light emitting active layer sandwiched between a p-type semiconductor multi-layer mirror and an n-type semiconductor multi-layer mirror on a semiconductor substrate and a pair of electrodes for injecting current into the active layer, wherein said p-type semiconductor multi-layer mirror is made of at least two kinds of III-V compound semiconductor layers with different types of group III atoms from each other and with different refractive indices, and said n-type semiconductor multi-layer mirror is made of at least two kinds of III-V compound semiconductor layers with different types of group V atoms from each other and with different refractive indices.

5. A surface emitting semiconductor laser according to claim 1, wherein the semiconductor layer having the largest energy gap among at least two kinds of semiconductor layers constituting said p-type semiconductor multi-layer mirror has a higher p-type doping concentration than other semiconductor layers have, and the semiconductor layer having the largest energy gap among at least two kinds of semiconductor layers constituting the n-type semiconductor multi-layer mirror has a higher n-type doping concentration than other semiconductor layers have.

6. A surface emitting semiconductor laser of a laminated structure having at least a light emitting active layer sandwiched between a p-type semiconductor multi-layer mirror and an n-type semiconductor multi-layer mirror on a semiconductor substrate and a pair of electrodes for injecting current into the active layer, wherein said p-type semiconductor multi-layer mirror is made of a combination selected from a group comprising a combination of InGaAsP and InAlAs, a combination of InGaAsP and InGaAlAs, a combination of InAlAs and InGaAlAs, a combination of InGaAsP and InAlAsP, and a combination of InGaAlAs and InGaAlAs having different Al compositions, and said n-type semiconductor multi-layer mirror is made of a combination of InP and InGaAsP, or InGaAsP and InGaAsP having different composition ratios of In, Ga, As and P from each other.

7. A surface emitting semiconductor laser according to claim 1, wherein said semiconductor substrate is made of InP.

8. A surface emitting semiconductor laser according to claim 1, wherein said semiconductor substrate has a p conductivity type.

9. A surface emitting semiconductor laser according to claim 1, wherein said active layer is constructed by at least one quantum well type layer structure.

10. A surface emitting semiconductor laser of a laminated structure having at least a light emitting InGaAs quantum well type active layer sandwiched between a p-type semiconductor multi-layer mirror and an n-type semiconductor multi-layer mirror on a GaAs substrate and a pair of electrodes for injecting current into the active layer, wherein said p- and n-type semiconductor multi-layer mirrors are made of two kinds of semiconductor layers with no Al and different refractive indices.

11. A surface emitting semiconductor laser according to claim 10, wherein said p- and n-type semiconductor multi-layer mirrors are made of a combination of InGaP and GaAs, or InGaAsP and GaAs.

* * * * *

UNITED STATES PATENT AND TRADEMARK OFFICE
CERTIFICATE OF CORRECTION

PATENT NO. : 5,363,393
DATED : November 8, 1994
INVENTOR(S) : Kazuhisa Uomi, et al It is certified that error appears in the above-indentified patent and that said Letters Patent is hereby corrected as shown below:

| Column | Line | |
|---|---|---|
| 1 | 18 | Change "μ n" to --μ m--. |
| 2 | 31 | Change "Δ EC" to --Δ Ec--. |
| 6 | 49 | Change "Spacer" to --spacer--. |
| 8 | 24 | After "least" insert --a--. |

Signed and Sealed this

Sixteenth Day of May, 1995

Attest:

BRUCE LEHMAN

Attesting Officer           Commissioner of Patents and Trademarks